(12) United States Patent
Lu (10) Patent No.: US 6,760,381 B2
(45) Date of Patent: Jul. 6, 2004

(54) HIGH-VOLTAGE DIFFERENTIAL DRIVER USING STACKED LOW-BREAKDOWN TRANSISTORS AND NESTED-MILLER COMPENSATION

(75) Inventor: Crist Y. Lu, Fremont, CA (US)

(73) Assignee: Centillium Communications Inc., Fremont, CA (US)

( * ) Notice: Subject to any disclaimer, the term of this patent is extended or adjusted under 35 U.S.C. 154(b) by 729 days.

(21) Appl. No.: 09/681,102

(22) Filed: Jan. 5, 2001

(65) Prior Publication Data

US 2002/0090034 A1 Jul. 11, 2002

(51) Int. Cl.[7] ............................. H04B 3/00; H03F 3/45
(52) U.S. Cl. ..................................... 375/257; 330/253
(58) Field of Search ............................ 375/257, 258, 375/288, 224; 327/333, 563, 52; 330/253, 261, 252, 285, 292

(56) References Cited

U.S. PATENT DOCUMENTS

| | | | |
|---|---|---|---|
| 4,697,155 A | 9/1987 | Lehning | 330/297 |
| 4,730,168 A | 3/1988 | Senderowicz et al. | 330/253 |
| 4,737,732 A * | 4/1988 | Westwick | 330/261 |
| 4,766,394 A | 8/1988 | Yukawa | 330/253 |
| 4,797,632 A | 1/1989 | Guery | 330/285 |
| 4,890,014 A | 12/1989 | Ramet | 307/355 |
| 5,144,297 A | 9/1992 | Ohara | 340/825.79 |
| 5,212,455 A | 5/1993 | Pernici et al. | 330/253 |
| 5,315,264 A | 5/1994 | Sundby et al. | 330/253 |
| 5,486,790 A | 1/1996 | Huijsing et al. | 330/260 |
| 5,504,444 A | 4/1996 | Neugebauer | 327/108 |
| 5,638,322 A * | 6/1997 | Lacey | 365/185.2 |
| 5,666,087 A | 9/1997 | Gorecki | 330/260 |
| 5,748,040 A | 5/1998 | Leung | 330/253 |
| 5,854,573 A | 12/1998 | Chan | 330/292 |
| 5,909,146 A | 6/1999 | Okada | 330/255 |
| 5,917,340 A * | 6/1999 | Manohar et al. | 326/82 |
| 5,959,472 A | 9/1999 | Nagamatsu et al. | 327/108 |
| 6,002,299 A | 12/1999 | Thomsen | 330/9 |
| 6,018,267 A | 1/2000 | Tran et al. | 330/253 |
| 6,028,479 A | 2/2000 | Babanezhad | 330/253 |
| 6,100,713 A | 8/2000 | Kalb et al. | 326/30 |
| 6,111,431 A | 8/2000 | Estrada | 326/83 |
| 6,377,121 B1 * | 4/2002 | Giduturi | 330/253 |
| 6,472,908 B1 * | 10/2002 | Smetana | 327/52 |

* cited by examiner

Primary Examiner—Khai Tran
(74) Attorney, Agent, or Firm—Stuart T. Auvinen (57) ABSTRACT

An amplifier drives a Digital-Subscriber Line (DSL) using a 12-volt power supply. Ordinary low-voltage transistors for 5-volt systems are stacked together to reduce the average voltage across each transistor to below a breakdown voltage. The output stage uses p-channel and n-channel driver transistors that are coupled to differential outputs through cascode transistors. A common-mode voltage is fed back to a second stage to adjust signals for deviations in the common-mode output bias. A first stage buffers a pair of differential inputs to the second stage. The second stage uses level shifting to generate four signals to the output stage driver transistors. A pair of high-voltage signals drives the p-channel drivers while a pair of low-voltage signals drives the n-channel driver transistors. Nested miller compensation stabilizes the amplifier using capacitors between the final outputs and the four signals from the second stage and the differential signals from the first stage.

21 Claims, 6 Drawing Sheets

HIGH-VOLTAGE DIFFERENTIAL DRIVER USING STACKED LOW-BREAKDOWN TRANSISTORS AND NESTED-MILLER COMPENSATION

BACKGROUND OF INVENTION

This invention relates to integrated circuit amplifiers, and more particularly to differential amplifiers for driving high-voltage outputs.

High-speed telephone lines such as Digital-Subscriber Lines (DSL) need high-performance drivers. These line drivers must be able to rapidly drive signals on a copper pair telephone line. The line may be several kilometers in length and have a significant load that is much larger than the loads experienced in other systems such as computers and local-area networks.

Design of such DSL line drivers is thus quite challenging. While most digital systems operate at 5 volts or less, DSL lines can be driven with 12-volt signals which is then stepped-up by a transformer to the 35-volt peak-to-peak required by telephone line. However, the more voltage is stepped up, the more current has to be driven, even though the power delivered is the same. This increased current makes lower voltage drivers more difficult. Additionally, when a large step-up is used, the noise requirements of the receive amplifier need to be very low, which is another difficulty.

Most semiconductor fabrication processes are targeted to manufacture of 5-volt, 3-volt, 1.8-volt and lower devices. Applying a 12-volt power supply to such low-voltage devices would cause unwanted breakdowns such as drain-to-source punch-through of complementary metal-oxide-semiconductor (CMOS) transistors. Physical damage to the integrated circuit could result. Thus special design techniques must be employed when designing high-voltage line drivers using low-voltage transistors.

DETAILED DESCRIPTION

The present invention relates to an improvement in high-voltage line drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
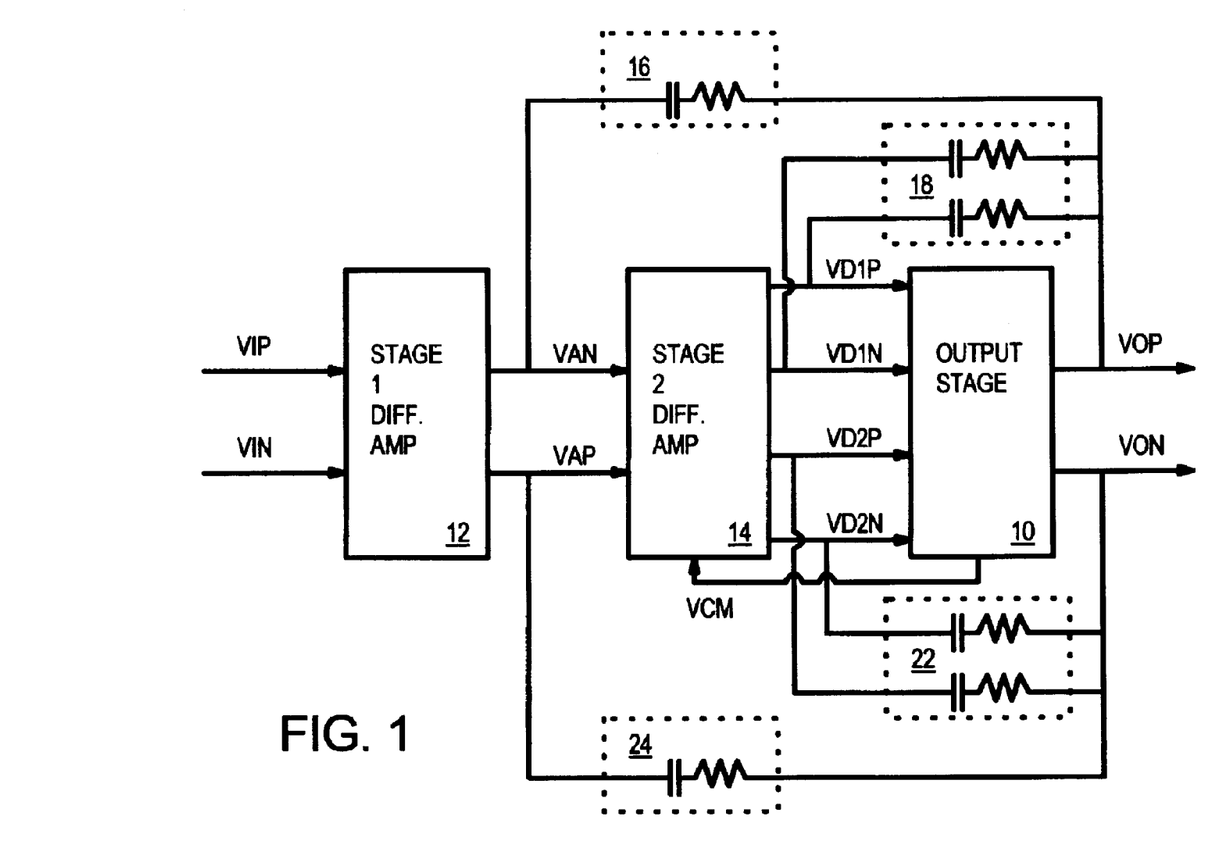
FIG. 1 is a block diagram of a three-stage high-voltage differential amplifier.

FIG. 1 is a block diagram of a three-stage high-voltage differential amplifier. Although only two stages could be used in some embodiments of the invention, better performance can be obtained by using three stages as shown. First stage 12 and second stage 14 are transconductance stages having differential inputs and outputs, while output stage 10 is a high-current-drive output stage. All stages operate using a power-supply of 12 volts and a zero-volt ground.

First stage 12 receives differential inputs VIP, VIN that carry a small-amplitude signal of +/−600 mV around a bias of about 6 volts. Differential signals VAP, VAN are generated by first stage 12 and input to second stage 14. These signal VAP, VAN are level-shifted up to a bias of around 9 volts and also have a small-signal swing of about +/−20 mV.

Second stage 13 receives VAP, VAN and generates two pairs of differential signals. Differential signals VD1P, VD2P have a high bias voltage near 11 volts, while differential signals VD1N, VD2N have a low bias voltage of about 1 volt. The high-voltage VD1P, VD2P signals are ideal for driving p-channel drivers in output stage 10, while the low-voltage VD1N, VD2N signals are ideal for driving n-channel driver transistors in output stage 10.

Output stage 10 receives the high-voltage differential signals VD1P, VD2P and the low-voltage differential signals VD1N, VD2N from second stage 14. Output stage 10 includes high-current drive transistors that drive outputs VOP, VON with a high-voltage differential signal with a wide signal swing about a bias of 6 volts. A low-distortion output swing of 2 to 10 volts is possible with a 12-volt power supply.

A common-mode voltage VCM is generated from VOP, VON by output stage 10. This common-mode voltage VCM is fed back to second stage 14 where a common-mode compensation circuit adjusts the bias voltages.

Nested-miller compensation is used to aid amplifier stability. Other feedback resistors (not shown) set the amplifier gain. Feedback 18 includes two sets of a series capacitor and resistor. One series capacitor-resistor set is between output VOP and differential signal VD1P, while the other series resistor-capacitor set is between output VOP and differential signal VD1N. Likewise feedback 22 contains a series capacitor-resistor between output VON and signal VD2P and another between VON and VD2N.

Feedback 16 contains a series resistor and capacitor between output VOP and signal VAN, which is output by first stage 12 and input to second stage 14. Feedback 24 contains a series resistor-capacitor between output VON and signal VAP.

Feedback 18, 22 provide negative feedback around the final stage while feedback 16, 24 provide negative feedback around two stages—second stage 14 and outputs stage 10.

Bandwidth is kept high to improve linearity. The feedback resistors can be used in an active termination arrangement to reduce the size of the external load resistor needed and the power dissipated by the external load resistor.

A pole exists for the output of each stage in the amplifier. First stage 12 generates a pole p1, second stage 14 generates a pole p2, while output stage 10 generates a third pole p3. Capacitors in feedback 18, 22 around output stage 10 compensate by increasing the frequency of output pole p3 but reducing the frequency of pole p2. Feedback 16, 24 around second stage 14 and output stage 10 compensates by further reducing the frequency of pole p2 and increasing the frequency of pole p1 while output pole p3 is made slightly lower in frequency but remains high. This pole-splitting results in a stable amplifier with a wide frequency range of linearity. The resistors in series in feedback 16, 18, 22, 24 introduce zeros to further aid stability.

The capacitance and resistance values in feedback 16, 18, 22, 24 are 3 pF and 200 ohms, except for the series capacitor-resistor between VOP and VD1P, and the series capacitor-resistor between VON and VD2P, which are 1 pF and 800 ohm. Of course, different capacitance and resistance values may be selected in other embodiments and for different semiconductor process technologies.

Figure 2:
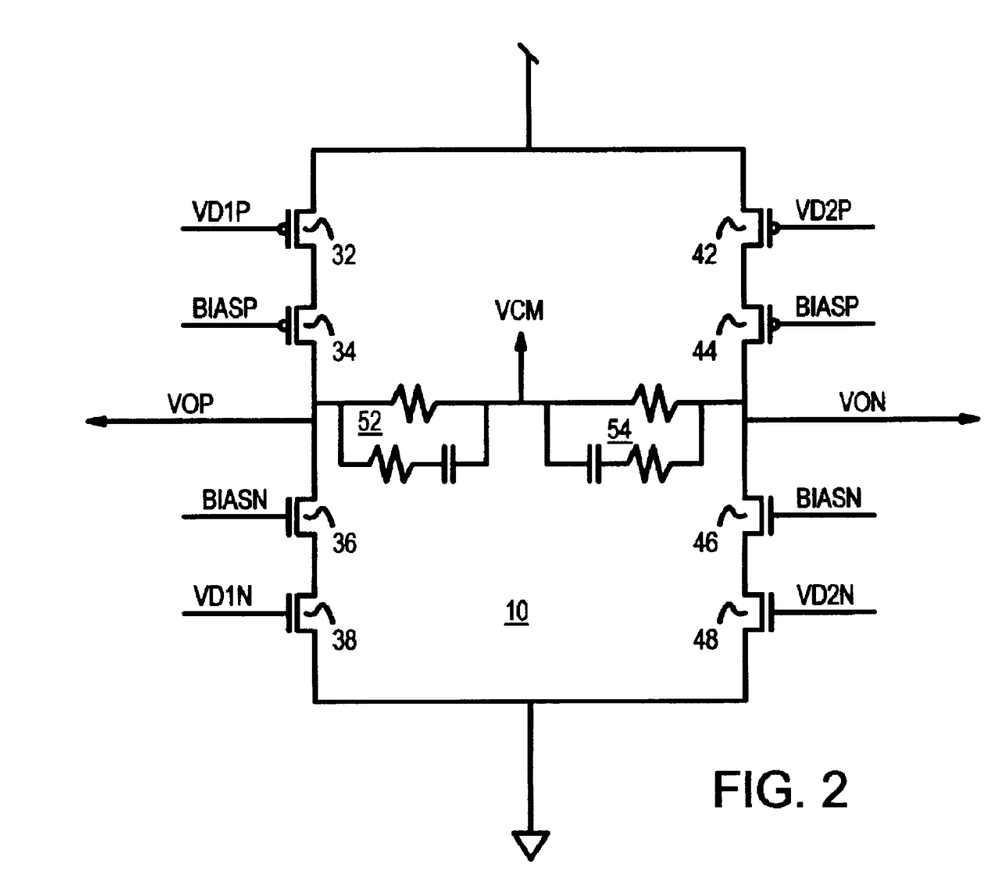
FIG. 2 is a schematic of the output stage using stacked transistors for high-voltage operation.

FIG. 2 is a schematic of the output stage using stacked transistors for high-voltage operation. The transistors used are standard complementary metal-oxide-semiconductor (CMOS) transistors that are designed for low-voltage operation, such as with a 5-volt power supply. Applying a high-voltage power supply of 12 volts across the source-drain terminals of one of these low-voltage transistors can result in physical damage and an unwanted shorting or breakdown between the source and drain terminals. Thus high-voltage supplies are not normally used with such transistors.

To reduce the electric field across the source-drain terminals of the transistors, several transistors are stacked together in a cascode arrangement. Stacking transistors divides the high voltage among several transistors, reducing the voltage drop across any one transistor. For example, when four transistors are stacked between a 12-volt power supply and ground, the average voltage across each transistor is only 12/4 or 3 volts.

Output stage 10 is a cascode differential amplifier. A constant bias voltage BIASP of about 7 volts is applied to the gates of p-channel cascode transistors 34, 44, while a bias voltage BIASN of about 5 volts is applied to the gates of n-channel cascode transistors 36, 46. Bias voltages BIASP, BIASN can be generated with voltage-divider or band-gap bias generators to compensate for process, temperature, and power-supply-voltage variations. The common-mode voltage VCM generated by output stage 10 can also be input to the bias-generating circuits to provide further compensation for loading and other output effects, although this is certainly not required.

P-channel driver transistors 32, 42 have drains connected to the sources of p-channel cascode transistors 34, 44. P-channel driver transistors 32, 42 have sources connected to the 12-volt power supply, and modulate or switch current in response to small-signal changes in differential signals VD1P, VD2P, which are connected to the gates of driver transistors 32, 42, respectively.

N-channel driver transistors 38, 48 have drains connected to the sources of n-channel cascode transistors 36, 46. N-channel driver transistors 38, 48 have sources connected to ground, and modulate additional current in response to small-signal changes in differential signals VD1N, VD2N, connected to the gates of driver transistors 38, 48, respectively.

Differential output VOP is taken from the drains of p-channel cascode transistor 34 and n-channel cascode transistor 36. Likewise, differential output VON is taken from the drains of p-channel cascode transistor 44 and n-channel cascode transistor 46.

Differential inputs VD1P, VD2P are biased to around 11 volts, with small-signal swings from about 10.5 to 11.3 volts. When VD1P rises, VD2P falls. This high voltage keeps p-channel driver transistors 32, 42 operating in the linear region most of the time, although at higher voltages one of driver transistors 32, 42 can begin to shut off, resulting in some clipping of the output waveforms and loss of linearity.

Low-voltage differential inputs VD1N, VD2N are biased to around 1 volt, with small-signal swings from about 0.5 to 1.3 volts. When VD1N rises, VD2N falls. This low voltage keeps n-channel driver transistors 38, 48 operating in the linear region most of the time, although at very low voltages near 0.5 volt one of driver transistors 38, 48 can begin to shut off, resulting in some clipping of the output waveforms and loss of linearity.

In operation, VD1P and VD2P are complementary to each other, while VD1N and VD2N are also complementary, in the sense that one signal of the pair rises while the other falls in voltage. Each pair of signals is also corresponding to the other pair. For example, when VD1P rises, VD1N also rises, while VD2P and VD2N fall.

When VD1P rises, the higher gate voltage on p-channel driver transistor 32 reduces the current through p-channel transistors 32, 34. This lowers the voltage of VOP. At the same time, VD1N also rises, increasing the gate voltage and current drive for n-channel driver transistor 38. Thus more current flows to ground through n-channel transistors 36, 38, further reducing the voltage on VOP. The voltage of the complement output VON rises, since lower voltages of VD2P and VD2N increase current drive on p-channel driver transistor 42 while decreasing current drive in n-channel driver transistor 48. Output stage 10 thus acts as a push-pull or class AB amplifier.

Cascode transistors 34, 44, 36, 46 remain on in linear region whenever VOP or VON increases above 7V+Vt, or about 8V. They are in saturation the rest of the time. For much of the small-signal swings of differential inputs VD1P, VD2P, VD1N, VD2N they are in the linear region, since their gate bias voltages are near Vdd/2. At extreme output voltages, at least one of the p-channel or n-channel cascode transistors remains on, reducing the voltage across the channel of the driver transistors. These cascode transistors serve to reduce the source-drain as well as gate-drain voltage applied to the driver transistors, reducing the likelihood of channel breakdown of the driver transistors.

The midpoint or common-mode voltage VCM is generated by resistor networks 52, 54, which form a voltage divider between outputs VOP and VON. When the resistor values in networks 52, 54 are equal, the common-mode voltage VCM is the average or midpoint voltage of VOP and VON. Each resistor network 52, 54 has a series resistor between the output (VOP or VON) and VCM, and a second path in parallel with a resistor in series with a capacitor. The capacitors store charge, thereby averaging voltages over time. At high output frequencies, the capacitors act as short circuits, speeding up generation of VCM. In operation of one embodiment, VCM varies within +/−40 mV of 6 volts.

A high resistance value such as 5K-ohm can be used for the resistor in the path without the capacitor, while a low resistance value such as 200 ohm can be used for the resistor in series with a 1 pF capacitor. Polysilicon resistors and poly-to-poly capacitors can be integrated on the IC die with standard CMOS processes, although external higher-precision resistors and capacitors could also be used.

Some CMOS processes allow for two kinds of transistors to be fabricated on the same integrated circuit (IC) chip. Some transistors are designed for 3-volt power supplies, while others are designed for 5-volt power supplies. The 3-volt transistors have lower breakdown voltages than the 5-volt transistors, but also have a higher current drive. Using 3-volt transistors in output stage 10 allows for higher current drive, while using 5-volt transistors in first stage 12 and second stage 14 provides better protection against breakdown. Transistors 32, 42, 38, 48 are 3-volt transistors, while transistors 34, 44, 36, 46 are 5-volt transistors.

Figure 3:
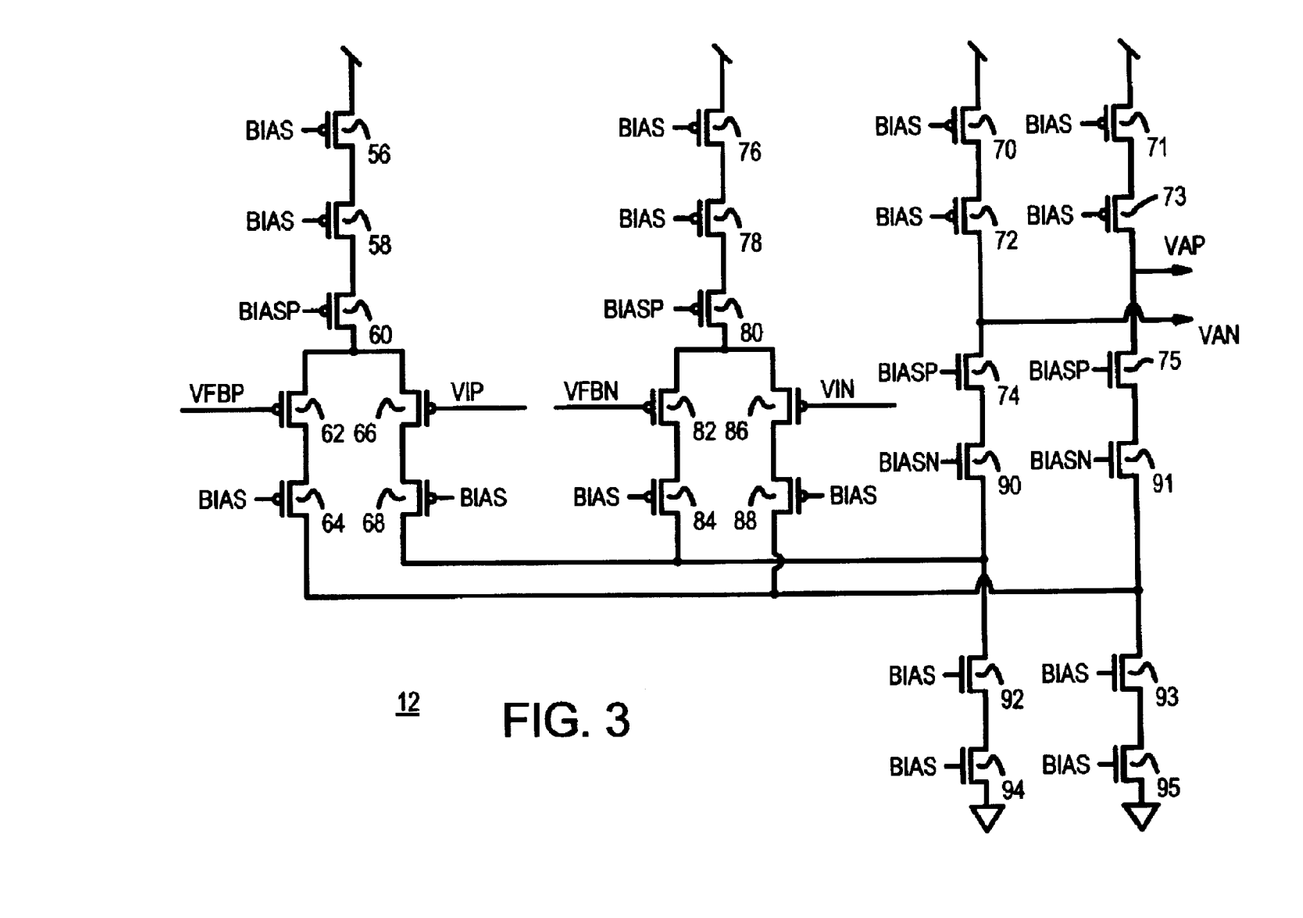
FIG. 3 is a schematic diagram of the first stage.

FIG. 3 is a schematic diagram of the first stage. First stage 12 receives differential inputs VIP, VIN and generates differential outputs VAP, VAN to the second stage. A first current is sourced by p-channel source transistors 56, 58, 60 which have gates driven by constant bias voltages. This first current is switched by a comparison of input VIP to a first reference voltage VFBP that can be generated by a band-gap reference circuit. VIP is applied to the gate of p-channel transistor 66 which is in series with p-channel transistor 68 having a constant gate bias. In the other leg, reference voltage VFBP is applied to the gate of p-channel transistor 62 while a constant bias is applied to p-channel transistor 64.

When VIP is larger than VFBP, more of the first current flows through p-channel transistors 62, 64 than through p-channel transistors 66, 68. This increases the current sunk through n-channel sink transistors 93, 95 and reduces the current through n-channel sink transistors 92, 94. The drain voltage of n-channel sink transistor 93 rises while the drain voltage of n-channel sink transistor 92 falls.

A second current is sourced by p-channel transistors 76, 78, 80, which also have constant gate biases. This second current is switched through either p-channel transistors 82, 84 or p-channel transistors 86, 88 and summed with the portions of the first current. Differential input VIN is applied to the gate of p-channel transistor 86 which is in series with fixed-gate-bias p-channel transistor 88. In the other leg, reference voltage VFBN is applied to the gate of p-channel transistor 82 while a constant bias is applied to p-channel transistor 84.

When VIN is smaller than VFBN, more of the second current flows through p-channel transistors 86, 88 than through p-channel transistors 82, 84. This further increases the current sunk through n-channel sink transistors 93, 95 and further reduces the current through n-channel sink transistors 92, 94. The drain voltage of n-channel sink transistor 93 rises still more while the drain voltage of n-channel sink transistor 92 falls. Thus as VIP rises and VIN falls, the switching of the first and second currents reinforces each other's effect.

A third current is generated by p-channel source transistors 70, 72, and flows to output VAN. This third current also flows through n-channel level-shift transistors 74, 90 to n-channel sink transistors 92, 94. A fourth current is generated by p-channel source transistors 71, 73, and flows to output VAP. This fourth current also flows through n-channel level-shift transistor 75, 91 to n-channel sink transistors 93, 95.

The higher drain voltage of n-channel sink transistor 93 reduces the gate-to-source voltage of n-channel level-shift transistor 91, thus reducing its current drive. The reduced current drive causes output VAP to rise in voltage as the constant fourth current charges output VAP.

Thus as VIP rises and VIN falls, VAP rises and VAN falls. First stage 12 is non-inverting.

Many different bias voltages can be generated by one or more reference circuits. For example, one bias is generated and applied to the gates of p-channel transistors 56, 76, and another to the gates of p-channel source transistors 70, 71. A second, lower bias voltage is applied to p-channel transistors 58, 78, 72, 73, and a third, even lower bias voltage BIASP of about 7 volts applied to p-channel transistors 60, 80, and n-channel transistors 74, 75. Another bias can be applied to the gates of p-channel transistors 64, 68, 84, 88, while a somewhat higher bias BIASN of about 5 volts can be applied to the gates of n-channel transistors 90, 91. Still lower biases can be generated for n-channel sink transistors 92, 93, with the lowest bias generated for n-channel sink transistors 94, 95.

The feedback voltages VFBP, VFBN can be about the same voltage as the midpoint of VIP, VIN, but may differ slightly from each other. The output signal of the driver is sensed and fed back to the input to form a closed-loop, or feedback design. In general, feedback improves linearity. VFBP and VFBN are the inputs of the driver where the fed back signal is connected. There are two differential pairs at the input so that the input impedance of the driver may be high impedance. i.e. the circuitry driving this driver sees gates of transistors instead of small resistors to virtual ground nodes.

Transistors are stacked or cascoded in each leg and each current source and sink to reduce the drain-source voltage across any single transistor. This stacking allows a high-voltage power supply such as 12 volts to be used with low-breakdown-voltage transistors that are designed for use with 5-volt or 3-volt power supplies. For example, six transistors are stacked in the final chains that generate VAP and VAN. This reduces the voltage across any one transistors to an average of Vcc/6, or 2 volts. If the stack had only 3 transistors, the average voltage across a transistor would be 4 volts, which is near the breakdown of some low-voltage transistors. As transistors are scaled down to smaller processes, breakdown voltages can decrease, increasing the need for stacking with newer processes.

Figure 4:
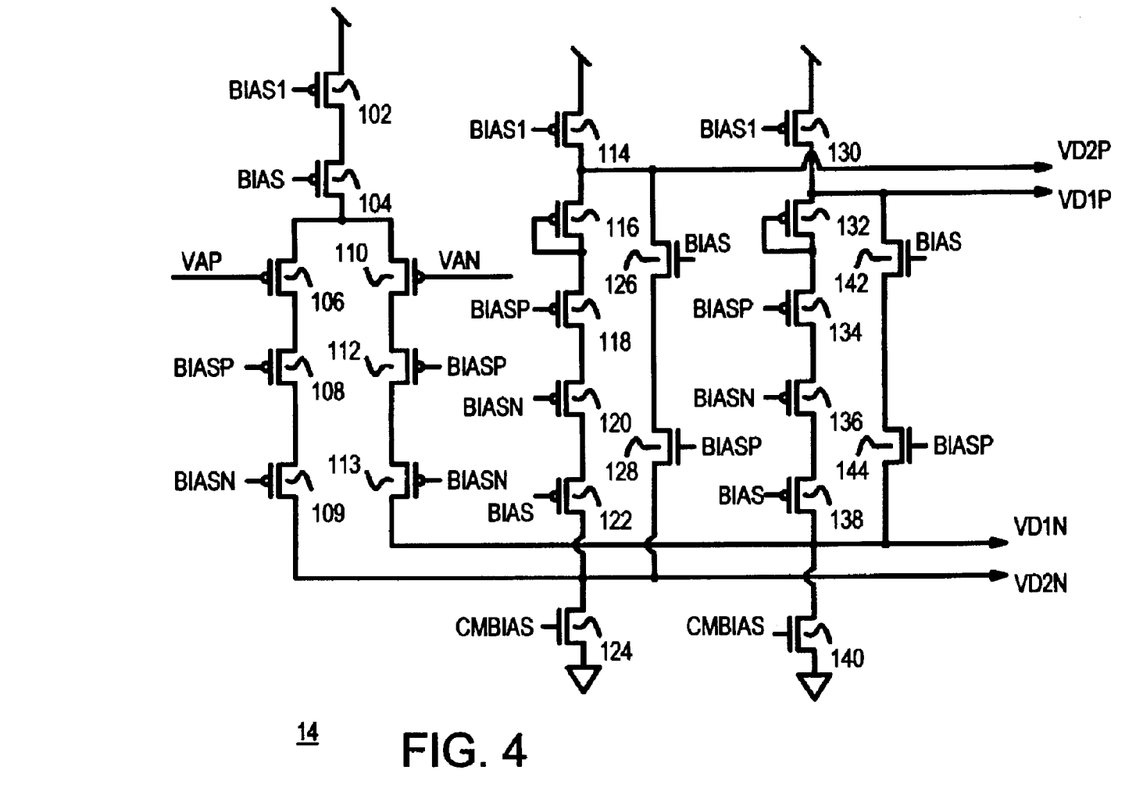
FIG. 4 is a schematic of the second stage.

FIG. 4 is a schematic of the second stage. Second stage 14 receives differential signals VAP, VAN from the first stage, and generates four outputs: high-voltage differential signals VD1P, VD2P at about 11 volts, and low-voltage differential signals VD1N, VD2N at about 1 volt.

A current is sourced by p-channel transistors 102, 104. This current is switched by p-channel differential transistors 106, 110, which have differential signals VAP, VAN applied to their respective gates. The current switched by VAP and p-channel transistor 106 flows through p-channel transistors 108, 109 to VD2N, while the current switched by VAN and p-channel transistor 110 flows through p-channel transistors 112, 113 to VD1N.

The switched current is sunk through n-channel sink transistors 124, 140. The gate bias of transistors 124, 140 is a bias CMBIAS corrected for common-mode changes. Common-mode voltage VCM from the output stage is compared to a reference voltage and used to adjust CMBIAS as shown later in FIG. 5.

A second current is sourced by p-channel source transistor 114, and flows to output VD2P and to VD2N through n-channel transistors 126, 128, or p-channel transistors 116, 118, 120, 122, which are parallel legs between VD2P and VD2N. These parallel legs level-shift the low-voltage VD2N to generate a higher voltage VD2P.

A third current is sourced by p-channel source transistor 130, and flows to output VD1P and to VD1N through n-channel transistors 142, 144, or p-channel transistors 132, 134, 136, 138, which are parallel legs between VD1P and VD1N. These parallel legs level-shift the low-voltage VD1N to generate a higher voltage VD1P.

In operation, when VAP rises and VAN falls, more of the switched current flows through the VAN leg of transistors 110, 112, 113 to VD1N than to VD2N. This additional current charges output VD1N to a higher voltage. Also, the increased current is sunk through n-channel sink transistor 140, increasing its drain voltage. VD1N rises while VD2N falls.

The higher voltage on VD1N is level-shifted by n-channel transistors 142, 144 to raise VD1P. The higher source voltage on n-channel level-shift transistor 144 reduces its current drive, causing the third current to charge VD1P to a higher voltage.

The lower VD2N lowers the source voltage of n-channel transistor 128, increasing its current drive. This allows more of the second current to flow to ground, reducing the voltage of VD2P. Thus VD1P rises, while VD2P falls. Since VD1P, VD1N rise while VD2P, VD2N fall when VAP rises, the second stage is also non-inverting.

Different bias voltages can be applied to the gates of the various cascode transistors. For example, the 7-volt bias BIASP can be applied to the gates of p-channel transistors 108, 112, 118, 134 and n-channel transistors 128, 144, while the 5-volt bias BIASN is applied to the gates of p-channel transistors 109, 113, 120, 136. Another higher bias can be generated for the gates of p-channel source transistors 102, 114, 130, and other biases generated for other cascode transistors.

Figure 5:
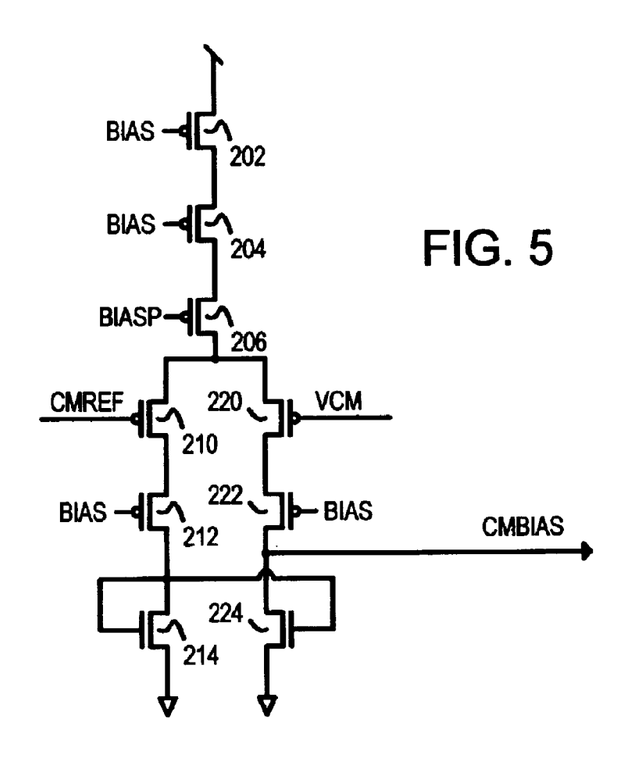
FIG. 5 is a schematic of a common-mode bias correction circuit.

FIG. 5 is a schematic of a common-mode bias correction circuit. The midpoint of outputs VOP, VON is generated by the output stage as common-mode voltage VCM.

A current is sourced by p-channel source transistors 202, 204, 206. This current is switched to right or left legs by a comparison of the common-mode voltage VCM to a reference voltage CMREF, which can be set to 6 volts for a 12-volt power supply. When VCM rises above the set point CMREF, then less current flows through p-channel switching transistor 220, which has VCM applied to its gate, and more current flows through p-channel switching transistor 210, which has CMREF at its gate. The increased current flows through p-channel transistors 210, 212 and n-channel transistor 214. The gate voltage of n-channel transistor 214 rises with the increased current.

Since this gate voltage is mirrored to the gate of n-channel transistor 224, the drain of n-channel transistor 224 falls in voltage with the current increase. P-channel transistor 222 couples the reduced current through p-channel switching transistor 220 to CMBIAS, further reducing CMBIAS.

The lowered voltage on the drain of n-channel transistor 224 is the common-mode bias CMBIAS that is used to adjust the second stage for changes in the common-mode voltage. The lowered bias CMBIAS reduces the current sinked by the second stage, increasing the common mode voltage of differential signals VD1P, VD2P, VD1N, VD2N. The higher voltages of these signals increases the n-channel driver currents and decreases the p-channel driver currents in the output stage, thus lowering the common mode voltage of final outputs VOP, VON. Thus changes in common-mode voltage VCM are used to adjust the common mode of the outputs of the second stage.

Figure 6:
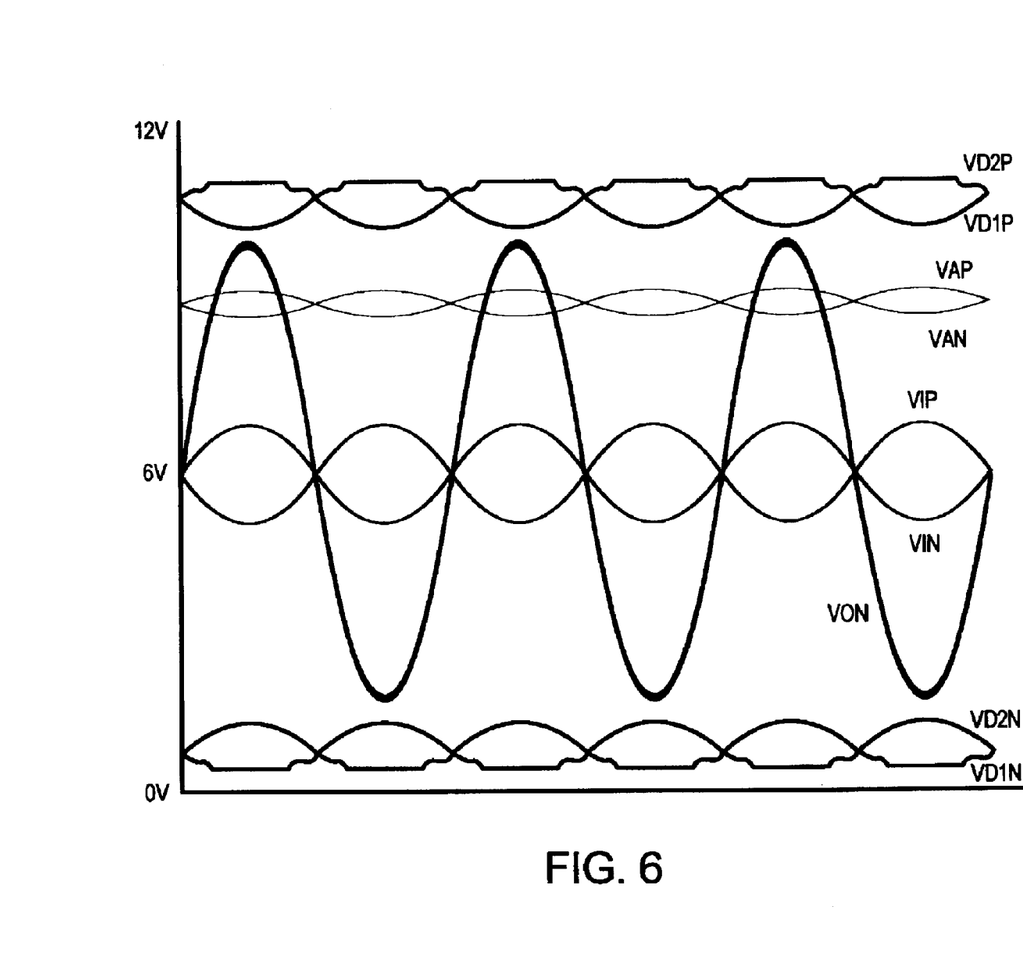
FIG. 6 is a waveform diagram of operation of the differential amplifier.

FIG. 6 is a waveform diagram of operation of the differential amplifier. A sine-wave input is applied to input VIP, and a complement of the sine wave is applied to input VIN of the first stage. In actual operation, complementary data is applied to differential inputs VIP, VIN, and can be simulated with a pseudo-random input pattern. Differential inputs VIP, VIN range from 5.4 to 6.6 volts, or 6 volts +/−600 mV. The first stage level-shifts differential inputs VIP, VIN to output signal VAP, VAN at 9.3 volts, +/−20 mV. When VIP rises, VAP also rises.

The second stage receives VAP, VAN and generates four outputs VD1P, VD2P, VD1N, VD2N. The high-voltage outputs VD1P, VD2P are at 10.9 volts. +/−400 mV, while the low-voltage outputs VD1N, VD2N are at 0.9 volt, +/−400 mV. VD1N, VD2N go up about 500 mV, but down about 100 mV and are thus not symmetric. When VAP rises and VAN falls, VD1P, VD1N fall and VD2P, VD2N rise.

The falling VD1P, VD1N and rising VD2P, VD2N cause output VON to fall and output VOP to rise. The outputs VOP, VON are centered at 6 volt and have a wide voltage swing of 2 to 10 volts.

Some distortion occurs on the inputs to the final output stage. High-voltage signals VD1P, VD2P are clipped as they rise within a transistor threshold voltage of Vcc, while low-voltage signals VD1N, VD2N are clipped when below the n-channel transistor threshold of about 0.5 volt.

Alternate Embodiments

Several other embodiments are contemplated by the inventor. For example other power-supply voltages higher or lower than 12 volts could be substituted such as a 6-volt or 15-volt supply. Only one transconductance stage, or 3 or more transconductance stages could be substituted for the two stages shown in the preferred embodiment. Many arrangements using stacked or cascoded transistors can be used, and many variations are possible on the circuit embodiments shown. Other processes such as BiCMOS could be used. Termination such as active or passive may be employed. Of course, any advantages and benefits described may not apply to all embodiments of the invention.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A line driver comprising:
    an output stage comprising:
        a first p-channel driver transistor, responsive to a first p-differential signal, for conducting current from a power supply;
        a first p-channel cascode transistor coupled to conduct current from the first p-channel driver transistor to a first differential output;
        a first n-channel driver transistor, responsive to a first n-differential signal, for conducting current to a ground;
        a first n-channel cascode transistor coupled to conduct current to the first n-channel driver transistor from the first differential output;

a second p-channel driver transistor, responsive to a second p-differential signal, for conducting current from the power supply;

a second p-channel cascode transistor coupled to conduct current from the second p-channel driver transistor to a second differential output;

a second n-channel driver transistor, responsive to a second n-differential signal, for conducting current to a ground; and a second n-channel cascode transistor coupled to conduct current to the second n-channel driver transistor from the second differential output;

wherein the first p-differential signal is a small-signal complement of the second p-differential signal wherein when the first p-differential signal rises, the second p-differential signal falls;

wherein the first n-differential signal is a small-signal complement of the second n-differential signal wherein when the first n-differential signal rises, the second n-differential signal falls;

wherein the power supply has a power-supply voltage greater than 6 volts and wherein transistors have breakdown voltages that are less than the power-supply voltage;

whereby four differential signals control driver transistors connected to differential outputs through cascode transistors.

2. The line driver of claim 1 wherein the power-supply voltage is nominally 12 volts.

3. The line driver of claim 2 wherein the first and second p-differential signals have a constant bias of about 11 volts, while the first and second n-differential signals have a constant bias of about 1 volt, whereby high and low voltage differential signals are input to the output stage.

4. The line driver of claim 1 further comprising:

a first resistor, coupled between the first differential output and a common-mode output;

a second resistor, coupled between the second differential output and the common-mode output, whereby the common-mode output is generated from the first and second differential outputs.

5. The line driver of claim 4 further comprising:

a first network coupled between the first differential output and the common-mode output, the first network comprising a third resistor in series with a first capacitor;

a second network coupled between the second differential output and the common-mode output, the second network comprising a fourth resistor in series with a second capacitor;

wherein the third and fourth resistors have a lower resistance than the first and second resistors.

6. The line driver of claim 5 further comprising:

a first miller network, coupled between the first differential output and the first p-differential signal, the first miller network including a capacitor;

a second miller network, coupled between the first differential output and the first n-differential signal, the second miller network including a capacitor;

a third miller network, coupled between the second differential output and the second p-differential signal, the third miller network including a capacitor; and a fourth miller network, coupled between the second differential output and the second n-differential signal, the fourth miller network including a capacitor;

whereby miller compensation is provided around the output stage.

7. The line driver of claim 6 wherein the first, second, third, and fourth miller networks each comprise a resistor in series with the capacitor.

8. The line driver of claim 7 further comprising:

a pre-driver stage, receiving an intermediate pair of differential signals including a first intermediate signal and a second intermediate signal, for generating the first and second p-differential signals and for generating the first and second n-differential signals, the pre-driver stage including stacked transistors between the power supply and ground to reduce an average voltage applied across a single transistor.

9. The line driver of claim 8 further comprising:

an initial stage, receiving an initial pair of differential signal, for generating the first and second intermediate signals to the pre-driver stage, the initial stage including stacked transistors between the power supply and ground to reduce an average voltage applied across a single transistor.

10. The line driver of claim 9 wherein the pre-driver stage and the initial stage each include at least four transistors stacked in series between the power supply and ground on any current-conducting path between the power supply and ground, whereby transistors are stacked at least four deep in all current-conducting paths in the initial and pre-driver stages.

11. The line driver of claim 9 further comprising:

a fifth miller network, coupled between the first differential output and the second intermediate signal, the fifth miller network including a capacitor; and a sixth miller network, coupled between the second differential output and the first intermediate signal, the sixth miller network including a capacitor, whereby miller compensation is provided around the pre-driver and output stages.

12. The line driver of claim 9 wherein the output stage uses n-channel transistors having a first breakdown voltage while the initial stage and the pre-driver stage use n-channel transistors having a second breakdown voltage, the first breakdown voltage being less than the second breakdown voltage, whereby n-channel transistors with a lower breakdown voltage are used in the output stage.

13. The line driver of claim 9 wherein the first and second p-differential signals are clipped near the power-supply voltage, while the first and second n-differential signals are clipped near ground, whereby signals to the output stage are clipped.

14. A high-voltage differential line driver comprising:

a driver stage comprising:

a first p-channel driver transistor, having a gate coupled to a first p-differential signal, a source coupled to a power supply, and a drain coupled to a first node;

a first p-channel cascode transistor having a gate coupled to a first bias voltage, a source coupled to the first node, and a drain coupled to a first differential output;

a first n-channel driver transistor, having a gate coupled to a first n-differential signal, a source coupled to a ground, and a drain coupled to a second node;

a first n-channel cascode transistor having a gate coupled to a second bias voltage, a source coupled to the second node, and a drain coupled to the first differential output;

a second p-channel driver transistor, having a gate coupled to a second p-differential signal, a source coupled to the power supply, and a drain coupled to a third node;

a second p-channel cascode transistor having a gate coupled to the first bias voltage, a source coupled to the third node, and a drain coupled to a second differential output;

a second n-channel driver transistor, having a gate coupled to a second n-differential signal, a source coupled to the ground, and a drain coupled to a fourth node; and a second n-channel cascode transistor having a gate coupled to the second bias voltage, a source coupled to the fourth node, and a drain coupled to the second differential output;

a first miller network comprising a resistor in series with a capacitor, coupled between the first differential output and the first p-differential signal;

a second miller network comprising a resistor in series with a capacitor, coupled between the first differential output and the first n-differential signal;

a third miller network comprising a resistor in series with a capacitor, coupled between the second differential output and the second p-differential signal; and a fourth miller network comprising a resistor in series with a capacitor, coupled between the second differential output and the second n-differential signal;

whereby miller compensation is provided to four differential inputs to the driver stage.

15. The high-voltage differential line driver of claim 14 further comprising:

a pre-driver stage for driving a small signal onto the first p-differential signal and onto the first n-differential signal, and for driving a complement of the small signal onto the second p-differential signal and onto the second n-differential signal, the pre-driver stage outputting a first common bias onto the first and second p-differential signals and outputting a second common bias onto the first and second n-differential signals;

wherein the first common bias is a higher voltage than the second common bias;

wherein the first bias voltage is a higher voltage than the second bias voltage.

16. The high-voltage differential line driver of claim 15 further comprising:

a fifth miller network comprising a resistor in series with a capacitor, coupled between the first differential output and a second differential input to the pre-driver stage;

a sixth miller network comprising a resistor in series with a capacitor, coupled between the second differential output and a first differential input to the pre-driver stage;

wherein the small signal is input to the pre-driver stage on the first differential input to the pre-driver stage while a complement of the small signal is input to the pre-driver stage on the second differential input to the pre-driver stage.

17. The high-voltage differential line driver of claim 16 wherein the pre-driver stage comprises:

a first current source comprising at least two transistors stacked in series to generate a first current;

a first leg coupled to receive a first portion of the first current, the first leg comprising a switching transistor that receives on a gate the first differential input to the pre-driver stage, in series with at least one cascode transistor having a fixed gate voltage, the first leg coupled to drive the first portion of the first current to the second n-differential signal;

a second leg coupled to receive a second portion of the first current, the second leg comprising a switching transistor that receives on a gate the second differential input to the pre-driver stage, in series with at least one cascode transistor having the fixed gate voltage, the second leg coupled to drive the second portion of the first current to the first n-differential signal;

a first n-channel current sink transistor coupled to sink current from the first n-differential signal;

a second n-channel current sink transistor coupled to sink current from the second n-differential signal;

a first level shifter, coupled between the first n-differential signal and the first p-differential signal, having at least two transistors in series, the at least two transistors having fixed gate voltages;

a third current source having a transistor with a fixed gate bias for generating a third current to the first p-differential signal and to the first level shifter;

a second level shifter, coupled between the second n-differential signal and the second p-differential signal, having at least two transistors in series, the at least two transistors having fixed gate voltages;

a third current source having a transistor with a fixed gate bias for generating a third current to the second p-differential signal and to the second level shifter.

18. The high-voltage differential line driver of claim 17 wherein the first and second n-channel current sink transistors each has a gate coupled to a corrected bias, the corrected bias generated by comparison of a common-mode voltage of the first and second differential outputs to a reference voltage.

19. The high-voltage differential line driver of claim 18 further comprising:

a parallel first level shifter, coupled in parallel between the first p-differential signal and the first n-differential signal with the first level shifter, the parallel first level shifter having at least three transistors in series;

a parallel second level shifter, coupled in parallel between the second p-differential signal and the second n-differential signal with the second level shifter, the parallel second level shifter having at least three transistors in series.

20. The high-voltage differential line driver of claim 14 wherein the first and second differential outputs are coupled to a Digital-Subscriber Line (DSL).

21. A differential driver comprising:

output stage means for driving a first and a second differential output comprising:

first p-channel driver transistor means, responsive to a first p-differential signal, for conducting current from a power supply;

first p-channel cascode transistor means for conducting current from the first p-channel driver transistor means to a first differential output;

first n-channel driver transistor means, responsive to a first n-differential signal, for conducting current to a ground;

first n-channel cascode transistor means for conducting current to the first n-channel driver transistor means from the first differential output;

second p-channel driver transistor means, responsive to a second p-differential signal, for conducting current from the power supply;

second p-channel cascode transistor means for conducting current from the second p-channel driver transistor means to a second differential output;

second n-channel driver transistor means, responsive to a second n-differential signal, for conducting current to a ground; and second n-channel cascode transistor means for conducting current to the second n-channel driver transistor means from the second differential output;

pre-driver stage means, receiving a first and a second intermediate differential signal, for generating the first and second p-differential signals and the first and second n-differential signals;

first miller compensation means, coupled between the first differential output and the first p-differential signal, for stabilizing operation of the differential driver;

second miller compensation means, coupled between the first differential output and the first n-differential signal, for stabilizing operation of the differential driver;

third miller compensation means, coupled between the second differential output and the second p-differential signal, for stabilizing operation of the differential driver; and fourth miller compensation means, coupled between the second differential output and the second n-differential signal, for stabilizing operation of the differential driver, whereby operation is stabilized by miller compensation of differential signals.

* * * * *